United States Patent [19]

Mihara

[11] Patent Number: 5,216,274
[45] Date of Patent: Jun. 1, 1993

[54] IMAGE SENSOR
[75] Inventor: Akira Mihara, Kanagawa, Japan
[73] Assignee: Fuji Xerox Co., Ltd., Tokyo, Japan
[21] Appl. No.: 772,210
[22] Filed: Oct. 7, 1991
[30] Foreign Application Priority Data Jan. 11, 1991 [JP] Japan .................. 3-012608

[51] Int. Cl.$^5$ .............. H01L 27/14; H01L 31/00
[52] U.S. Cl. ...................... 257/448; 257/435; 257/459
[58] Field of Search .......... 250/208.1, 211 J; 357/30 H, 30 D, 32; 257/435, 448, 459

[56] References Cited

U.S. PATENT DOCUMENTS

| | | | |
|---|---|---|---|
| 4,714,836 | 12/1987 | Kitamura et al. | 250/578 |
| 4,764,682 | 8/1988 | Swartz | 357/30 H |
| 4,826,777 | 5/1989 | Ondris | 250/211 J |
| 4,827,117 | 5/1989 | Uchida et al. | 357/2 |
| 5,097,120 | 3/1992 | Kitamura et al. | 250/211 J |

Primary Examiner—Andrew J. James
Assistant Examiner—Sara W. Crane
Attorney, Agent, or Firm—Finnegan, Henderson, Farabow, Garrett & Dunner

[57] ABSTRACT

Each light-receiving element of an image sensor consists of a photodiode and a blocking diode which are connected in series such that their poles of the same type are connected to each other. Each of the photodiode and the blocking diode has, on a common base electrode, an ohmic contact layer, a photoconductive layer and a transparent electrode. The photodiode and the blocking diode are arranged side by side to extend along one direction. Two lead lines are connected to the respective transparent electrodes through holes formed in an insulating layer. Each lead line covers end portions of both the transparent electrodes of the photodiode and the blocking diode. Typically, the two transparent electrodes have an equal area.

7 Claims, 5 Drawing Sheets

IMAGE SENSOR

BACKGROUND OF THE INVENTION

The present invention relates to an image sensor for use in an image input section of facsimile machines, image scanners, etc. More particularly, the invention is directed to an image sensor having a plurality of light-receiving elements arranged in line, each consisting of a photodiode and a blocking diode connected in series such that their poles of the same type are connected to each other.

There have conventionally been proposed image sensors of the type in which each light-receiving element consists of a photodiode and a blocking diode connected in series such that their poles of the same type are connected to each other, and a plurality of such light-receiving elements are arranged in line to constitute a light-receiving element array.

FIG. 5 (plan view) and 6 (sectional view) show an example of a light-receiving element part of such a conventional image sensor. A photodiode PD and a blocking diode BD are formed on a substrate 1 made of, e.g., glass by sequentially depositing and patterning a metal electrode 2 made of, e.g., chromium, a photoconductive layer 4 made of, e.g., amorphous silicon hydride (a-Si:H), a transparent electrode 5 made of, e.g., indium tin oxide (ITO), and an insulating layer 6 made of, e.g., polyimide. Lead lines 7a, 7b made of, e.g., aluminum are connected to the respective transparent electrodes 5 through contact holes 8a, 8b of the insulating layer 6.

The photodiode PD has a light-receiving area A (hatched in FIG. 5) for receiving incident light from above. On the other hand, the blocking diode BD is entirely shielded by the lead line 7b so that no light reaches it.

A plurality (n) of light-receiving elements are arranged in line to form an array. As shown in FIG. 7, the lead lines 7b on the blocking diode BD side are connected to a shift register SR, while the lead lines 7a on the photodiode PD side is grounded through a loading resistor R. An output terminal Tout is connected to the loading resistor R on its photodiode PD side.

The operation of reading out charges in the above conventional image sensor will be described below.

First, the photodiodes PD are scanned by the shift register SR to sequentially receive signals through the respective blocking diodes BD, so that charges are stored in the photodiodes PD.

If light is incident on a certain photodiode PD during one scan, a charge proportional to an amount of the incident light is discharged from that photodiode PD. Then, reset signals (read pulses) are sequentially applied from the shift register SR, so that charges proportional to the released charges are provided to the photodiodes PD, respectively. During this re-charging, a potential generated at the output terminal Tout by a current flowing through the loading resistor R is detected as an image signal (see Japanese Patent Application Unexamined Publication No. Sho. 58-62978).

However, in the above conventional image sensor, when a charge released from the photodiode PD in response to incident light is distributed to the capacitors inherent in the photodiode PD and the blocking diode BD, some current flows through the loading resistor R to compensate for this charge reduction in the photodiode PD. This current impairs stability of the output signal.

To overcome this problem, another type of image sensor as shown in FIG. 8 (plan view) and 9 (sectional view) was proposed. In this image sensor, a plurality of light-receiving elements are arranged in line to form a light-receiving element array, in which each element consists of a first photodiode PD1 and a second photodiode PD2 that are opposed in proximity and connected in series such that their poles of the same type are connected to each other. The first photodiode PD1 and the second photodiode PD2 have such a structure that upon illumination they produce the same voltage to prevent a current from flowing outside. That is, they have the same size of the light-receiving area. One of the photodiodes PD1 and PD2 is used as the photodiode PD, and the other as the blocking diode BD. It was expected that the output signal would be stabilized.

However, the above type of image sensor still has the following problem. The aluminum patterns serve to define the light-receiving areas of the photodiode PD and the blocking diode BD, and also serve as the signal read line 7a for the photodiode PD and the bias line 7b for the blocking diode BD. If, as shown in FIG. 10, the aluminum patterns are formed out of position during a photolithography process, the ratio between the light-receiving areas of the photodiode PD and the blocking diode BD is deviated from the design value (e.g., 1:1). As a result, the voltages of the diodes PD and BD when they are illuminated become unequal, that is, some current flows outside. This current impairs stability of the output signal.

SUMMARY OF THE INVENTION

The present invention has been made in view of the above circumstances. Accordingly, an object of the invention is to provide an image sensor capable of maintaining the ratio between light-receiving areas of a photodiode and a blocking diode to ensure stability of an output signal, even if aluminum-made light-shielding patterns are formed out of position.

According to the invention, in an image sensor comprising a plurality of combinations of a photodiode and a blocking diode connected in series such that their poles of the same type are connected to each other, each combination of the photodiode and the blocking diode comprises:

a common base electrode, and a pair of ohmic contact layers, a pair of photoconductive layers and a pair of transparent electrodes which are formed on the common base electrode and arranged side-by-side to extend along a particular direction;

an insulating layer covering the pair of transparent electrodes; and two light-shielding lead lines connected to the respective transparent electrodes through holes of the insulating layer, the two leadlines being formed such that each of the two lead lines covers parts of both the transparent electrodes of the photodiode and the blocking diode to provide respective light-receiving areas thereof.

DESCRIPTION OF THE PREFERRED EMBODIMENT

An image sensor according to an embodiment of the invention will be described hereinafter with reference to the accompanying drawings.

Figure 1:
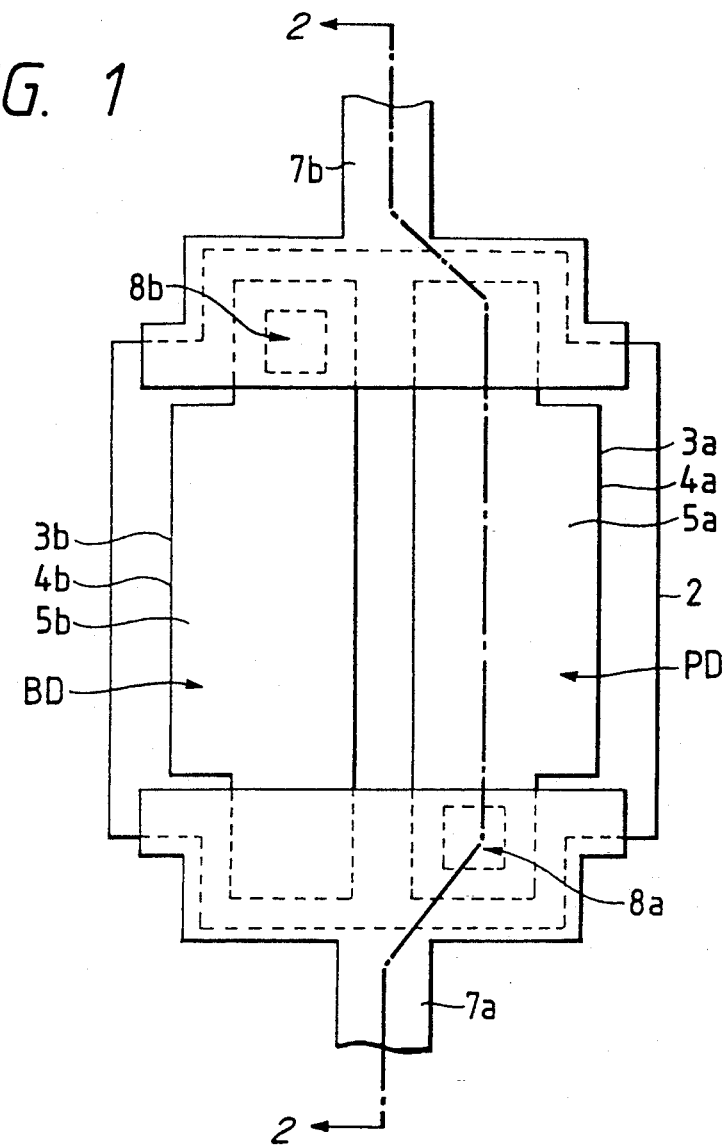
FIG. 1 is a plan view showing a light-receiving element part of an image sensor according to an embodiment of the invention.
Figure 2:
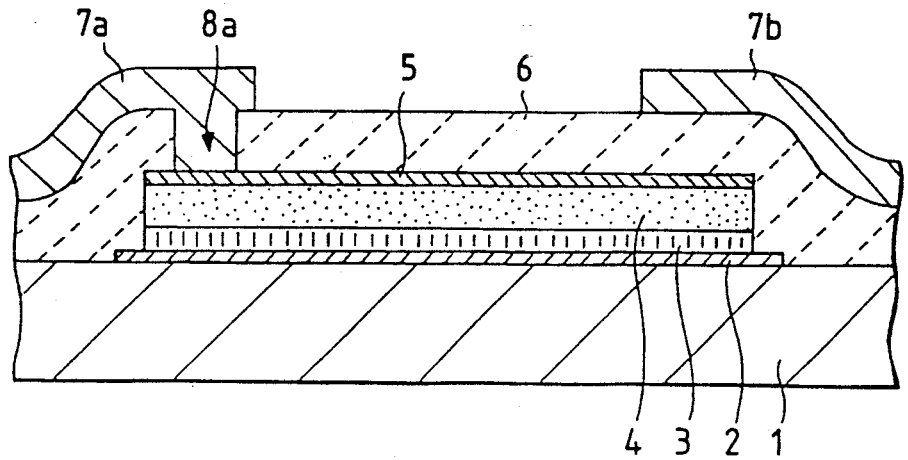
FIG. 2 is a sectional view taken along line A—A' in FIG. 1.

FIG. 1 is a plan view showing a light-receiving element part of the image sensor of the embodiment. FIG. 2 is a sectional view taken along line A—A' in FIG. 1. In these figures, the parts and components corresponding to those in FIGS. 5-10 are designated by the same reference numerals.

A photodiode PD and a blocking diode BD are formed by sequentially depositing and patterning a metal electrode 2 made of, e.g., chromium, an n+ ohmic contact layer 3, a photoconductive layer 4 made of, e.g., amorphous silicon hydride (a-Si:H), a transparent electrode 5 made of, e.g., indium tin oxide (ITO), and an insulating layer 6 made of, e.g, polyimide. The photodiode PD and the blocking diode BD are connected in series such that their poles of the same type are connected to each other, and the ohmic contact layers $3a$, $3b$, photoconductive layers $4a$, $4b$ and transparent electrodes $5a$, $5b$ are arranged such as to be symmetrical with respect to the central vertical line in FIG. 1.

The transparent electrodes $5a$, $5b$ of the photodiode PD and the blocking diode BD are connected to lead lines $7a$, $7b$ made of, e.g., aluminum through contact holes $8a$, $8b$ of the insulating layer 6, respectively. The lead line $7b$ serves as a bias line for the blocking diode BD, while the lead line $7a$ serves as a signal read line for the photodiode PD. The lead lines $7a$, $7b$ also act as light-shielding members, and define light-receiving areas of the photodiode PD and blocking diode BD. The ratio between the two light-receiving areas are set at 1:1.

As described above, the photodiode PD and the blocking diode BD are formed on the common metal electrode 2 such as to be symmetrical with respect to the vertical center line in FIG. 1. More specifically, in FIG. 1, the blocking diode BD is formed on the left side, and the photodiode PD on the right side. The lead line $7b$ serving as the bias line for the blocking diode BD is arranged at the top, and connected to the transparent electrode $5b$ through the contact hole $8b$ at the upper left portion. The lead line $7a$ serving as the signal read line for the photodiode PD is arranged at the bottom, and connected to the transparent electrode $5a$ through the contact hole $8a$ at the lower right portion.

Therefore, as shown in FIGS. 1 and 2, the photodiode PD and the blocking diode BD have a long and narrow shape.

A method of fabricating the light-receiving element part of the image sensor of the embodiment will be described next.

First, chromium is deposited on an insulating substrate 1 to a thickness of about 700 to 750 Å, and then patterned to form a metal electrode 2 which is to serve as a common electrode for the photodiode PD and the blocking diode BD.

Then, an n+-layer, an a-Si:H layer and an ITO layer are deposited to thicknesses of about 1,000 Å, 7,000 Å and 700 Å, respectively, and patterned into a shape as shown in FIG. 1 to form ohmic contact layers $3a$, $3b$, photoconductive layers $4a$, $4b$ and transparent electrodes $5a$, $5b$ of the photodiode PD and the blocking diode BD, respectively.

Successively, polyimide for an insulating layer 6 is deposited to a thickness of about 1.3 $\mu$m, and contact holes $8a$, $8b$ for the photodiode PD and the blocking diode BD are formed by a photolithography/etching process.

Then, to form lead lines $7a$, $7b$ serving not only as the signal read line for the photodiode PD and the bias line for the blocking diode BD, respectively, but also as the light-shielding patterns for the diodes PD and BD, aluminum is deposited to a thickness of about 1 $\mu$m and patterned to be shaped as shown in FIG. 1.

More specifically, the line $7b$, which is connected to the transparent electrode $5b$ of the blocking diode BD through the contact hole $8b$, is patterned such as to cover the top end portions of both of the transparent electrode $5b$ of the blocking diode BD and the transparent electrode $5a$ of the photodiode PD by the same area. Similarly, the line $7a$, which is connected to the transparent electrode of the photodiode PD through the contact hole $8a$, is patterned such as to cover the bottom end portions of both of the transparent electrode $5b$ of the blocking diode BD and the transparent electrode $5a$ of the photodiode PD by the same area.

Figure 3:
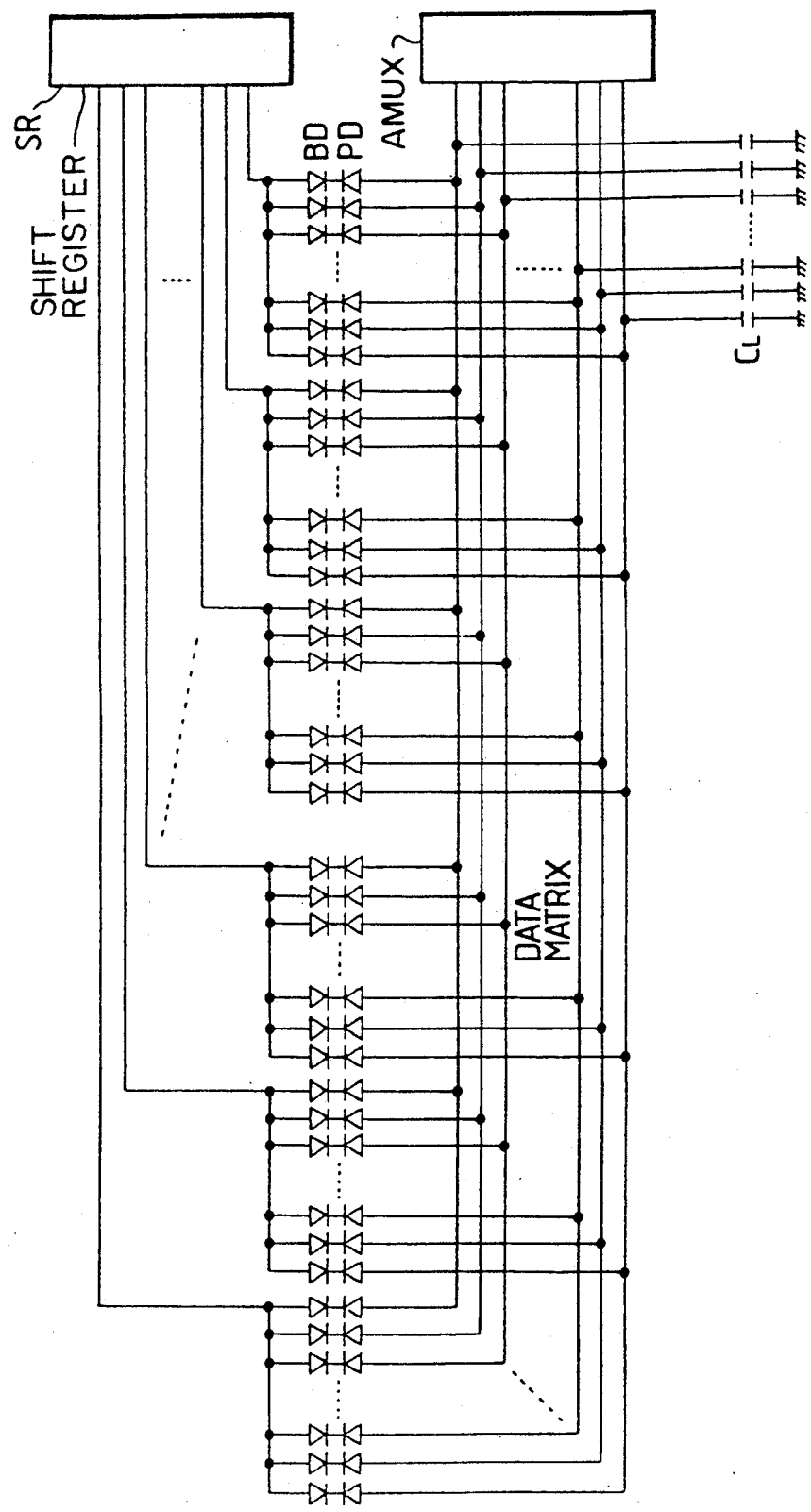
FIG. 3 is a circuit diagram of the image sensor of the embodiment.

The operation of the image sensor of the embodiment will be described with reference to a circuit diagram of FIG. 3.

When predetermined pulse voltages are applied to the photodiodes PD from a shift register SR through the respective blocking diodes BD on a block-by-block basis, a charge is stored across each photodiode PD.

Then, when the application of the pulse voltages is ended, the stored charge is distributed to the blocking diode BD and the photodiode PD in accordance with their capacitances. Since the light-receiving area of the photodiode PD is the same as that of the blocking diode BD, the capacitance ratio of this embodiment is 1:1.

When light is incident on the photodiode PD and the blocking diode BD, a photocurrent flows through each diode. Since both diodes PD and BD have the same design (i.e., same capacitance), a current of the same value flows therethrough. Further, since the diodes PD and BD are connected such that their poles of the same type are connected to each other, the currents flowing through the respective diodes PD and BD cancel out each other. Therefore, a current is prevented from flowing outside.

The charges stored in the photodiodes PD and the blocking diode BD are discharged in proportion to the photocurrents flowing through the respective diodes PD and BD.

Then, read pulses are applied sequentially from the shift register SR, so that charges proportional to the thus discharged charges are re-charged to the respective photodiodes PD. In this case, charges are also stored in capacitors $C_L$ arranged in a data matrix section. When the application of the read pulses is stopped, the charges stored in the photodiode PD and the capacitor $C_L$ are distributed to the blocking diode BD, photodiode PD and capacitor $C_L$ in accordance with their capacitances. Changes in potential of signal lines of the data matrix section are read out by an analog multiplexer AMUX to output an image signal.

Figure 4:
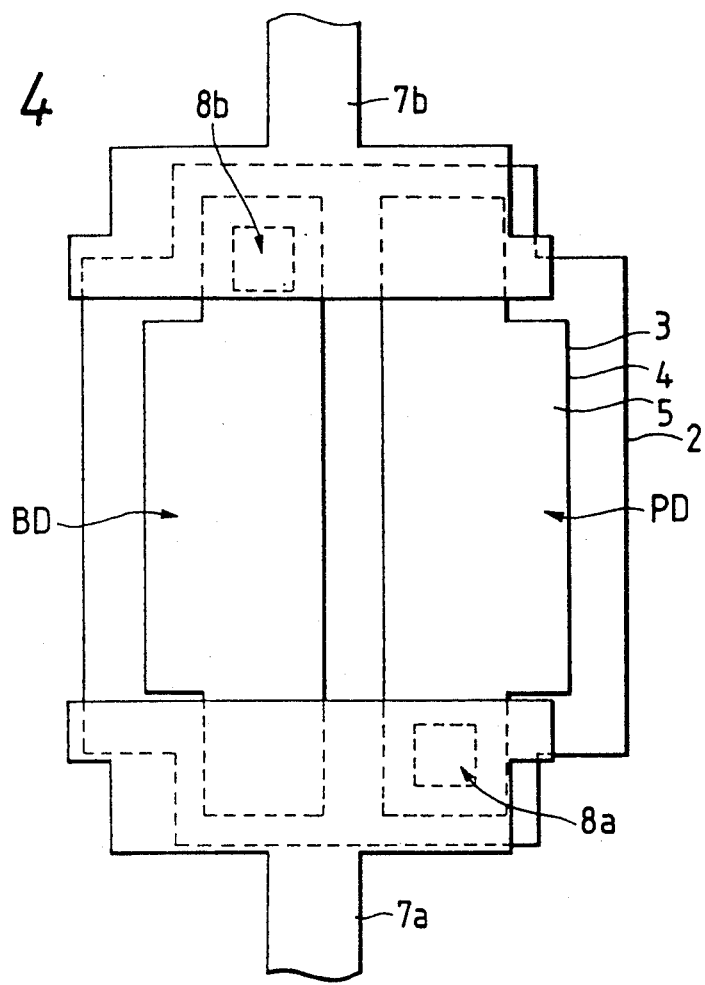
FIG. 4 is a plan view showing a light-receiving element part of the embodiment with its aluminum patterns misplaced.
Figure 5:
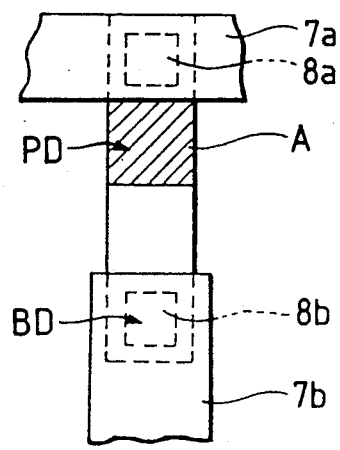
FIG. 5 is a plan view showing a light-receiving element part of a conventional image sensor.
Figure 6:
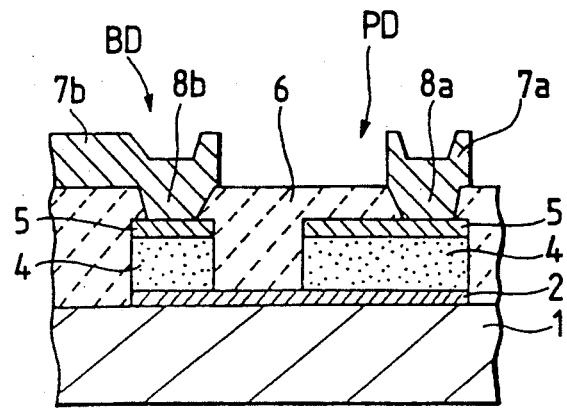
FIG. 6 is a sectional view of the image sensor of FIG. 5.
Figure 7:
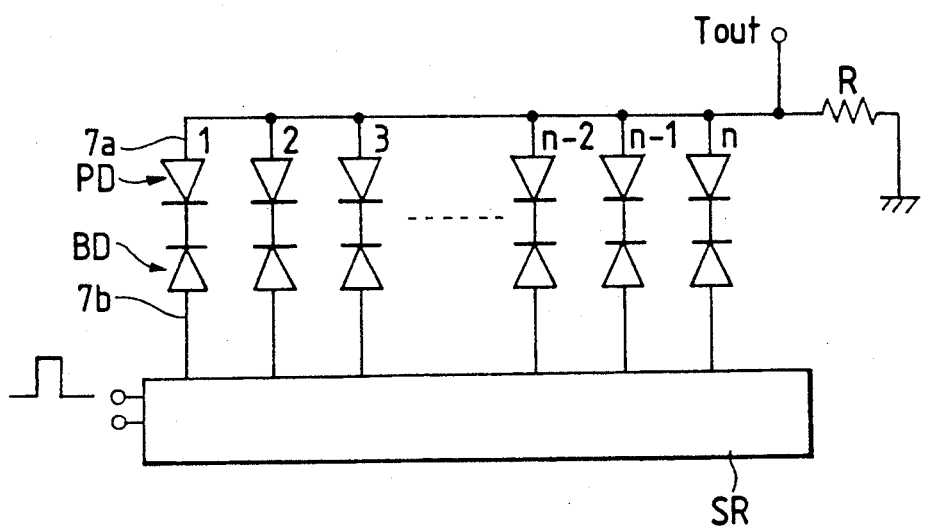
FIG. 7 is a circuit diagram of the conventional image sensor.
Figure 8:
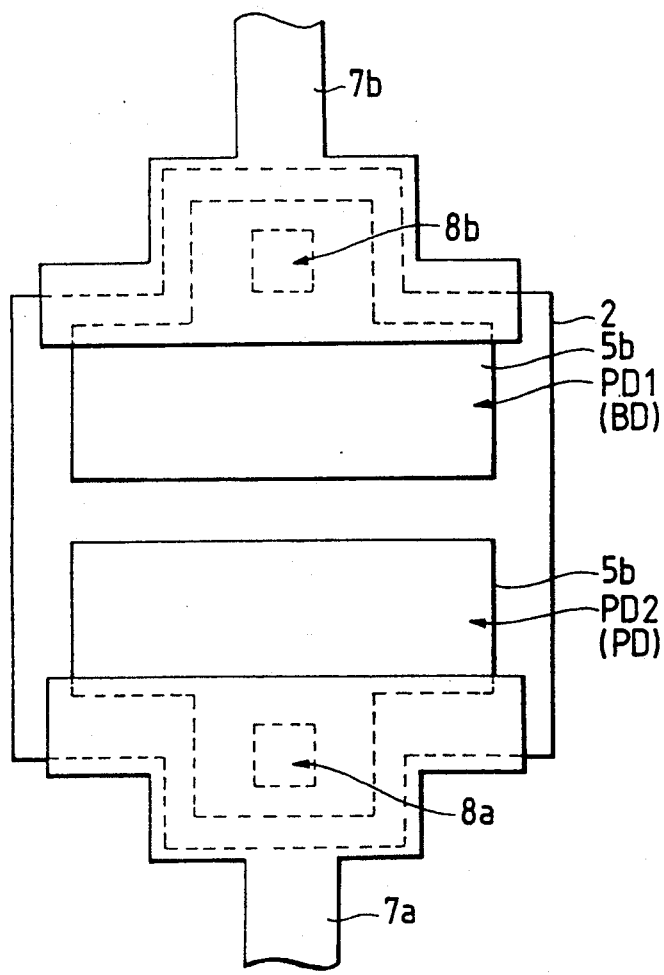
FIG. 8 is a plan view showing a light-receiving element part of an image sensor, in which a photodiode and a blocking diode have equal light-receiving areas.
Figure 9:
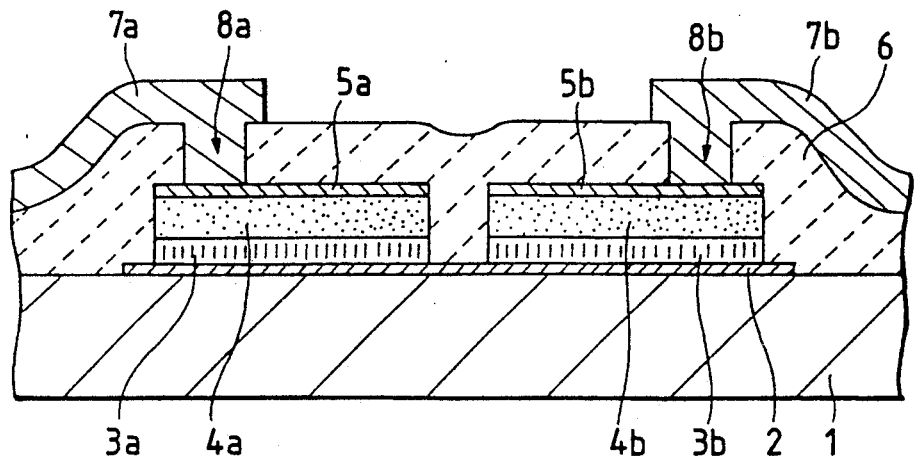
FIG. 9 is a sectional view of the image sensor of FIG. 8.
Figure 10:
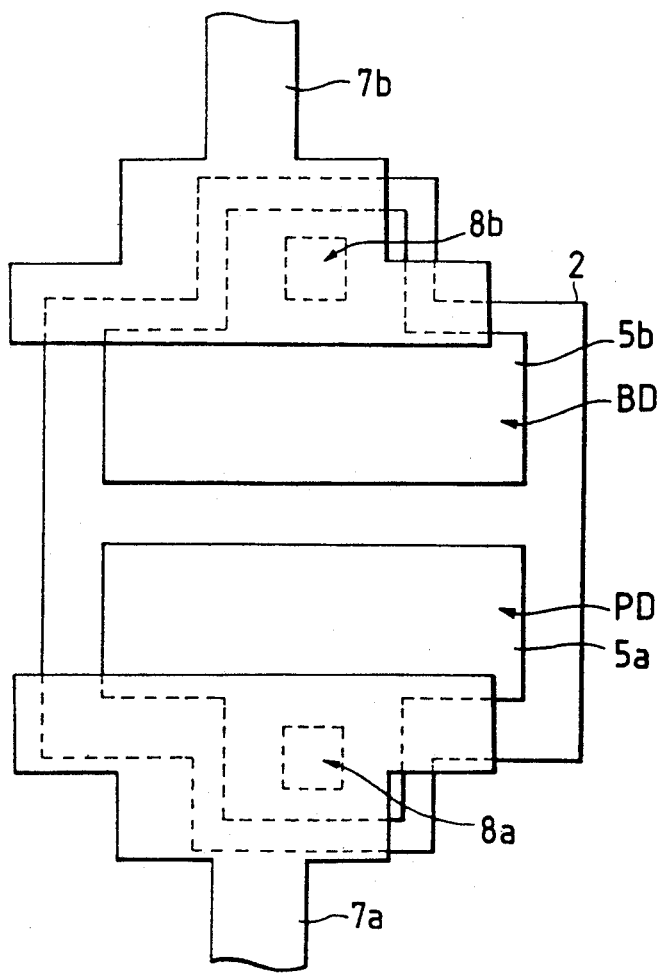
FIG. 10 is a plan view showing a light-receiving element part of the image sensor of FIGS. 8 and 9 with its aluminum patterns misplaced.

In the image sensor of the embodiment, since the long and narrow photodiode PD and the blocking diode BD are formed on the common metal electrode 2 as shown in FIG. 2, even if the Al-made lead lines 7a, 7b are arranged out of position as shown in FIG. 4, the ratio between the light-receiving areas of the photodiode PD and the blocking diode BD can be maintained. Therefore, the output signal can be stabilized.

As described above, according to the invention, a photodiode PD and a blocking diode BD are formed by arranging a pair of ohmic contact layers, a pair of photoconductive layers and a pair of transparent electrodes on a metal common electrode, and lead line patterns, which are connected to the transparent electrodes of the photodiode PD and the blocking diode BD, respectively through holes of an insulating layer, are formed such as to cover parts of both the transparent electrodes of the juxtaposed diodes PD and BD. Therefore, even if the lead line patterns are misplaced, the ratio between the light-receiving areas of the photodiode PD and the blocking diode BD can be maintained. As a result, when light is incident on both diodes, the output signal is well stabilized.

What is claimed is:

1. An image sensor comprising a plurality of combinations of a photodiode and a blocking diode connected in series such that their poles of the same type are connected to each other, each combination of the photodiode and the blocking diode comprising:

a common base electrode;

a pair of ohmic contact layers formed on the common base electrode in a side-by-side relation extending along a particular direction;

a separate photoconductive layer formed on each of the ohmic contact layers;

a separate transparent electrode formed on each of the photoconductive layers;

an insulating layer covering the transparent electrodes; and two light-shielding lead lines connected to the respective transparent electrodes through holes of the insulating layer, the two lead lines being formed such that each of the two lead lines covers parts of both the transparent electrode of the photodiode and the transparent electrode of the blocking diode to provide respective light-receiving areas thereof.

2. The image sensor according to claim 1, wherein widths of each of the transparent electrodes are the same in a first region where as edge of the lead line of the photodiode is located and in a second region where an edge of the lead line of the blocking diode is located.

3. The image sensor according to claim 1, wherein the light-receiving area of the photodiode and that of the blocking diode are substantially equal to each other.

4. The image sensor according to claim 1, wherein the pair of ohmic contact layers are made of substantially the same material and have substantially the same thickness.

5. The image sensor according to claim 1, wherein the photoconductive layers are made of substantially the same material and have substantially the same thickness.

6. The image sensor according to claim 1, wherein the transparent electrodes are made of substantially the same material and have substantially the same thickness.

7. The image sensor according to claim 1, wherein the poles of the same type are cathodes.

* * * * *